(12) United States Patent
Chu et al.

(10) Patent No.: US 6,249,932 B1
(45) Date of Patent: Jun. 26, 2001

(54) APPARATUS AND METHOD FOR REMOVING FINE PARTICLES

(75) Inventors: Yao-Chang Chu, Tainan; Chi-Kaung Paung, Hsin Chu; Jerry Shyr, Hsin-ten, all of (TW)

(73) Assignee: Taiwan Semiconductor Manufacturing Company, Ltd., Hsin Chu (TW)

( * ) Notice: Subject to any disclaimer, the term of this patent is extended or adjusted under 35 U.S.C. 154(b) by 0 days.

(21) Appl. No.: 09/240,107

(22) Filed: Jan. 29, 1999

(51) Int. Cl.[7] ........................................ A47L 5/14
(52) U.S. Cl. .............................. 15/345; 15/415.1
(58) Field of Search ................ 15/345, 346, 415.1

(56) References Cited

U.S. PATENT DOCUMENTS

| | | | |
|---|---|---|---|
| 868,901 | * 10/1907 | Williams | 15/345 |
| 2,181,487 | * 11/1939 | Khuen-Kryk | 15/345 |
| 2,238,541 | * 4/1941 | Spangnolo | 15/346 X |
| 3,268,942 | * 8/1966 | Rossnan | 15/346 |
| 3,328,827 | * 7/1967 | Lake et al. | 15/345 X |

FOREIGN PATENT DOCUMENTS

| | | | |
|---|---|---|---|
| 977910 | * 11/1975 | (CA) | 15/346 |
| 4135406 | * 5/1992 | (DE) | 15/346 |

* cited by examiner

Primary Examiner—Chris K. Moore
(74) Attorney, Agent, or Firm—Tung & Associates (57) ABSTRACT

A cleaning apparatus for removing fine particles from an uneven surface and a method for using such apparatus are disclosed. The cleaning apparatus can be used on any uneven surface, and is particularly suitable for use on a grooved surface such as that of an exposure table in a stepper. The apparatus includes a cleaning head having a head portion with a front surface for contacting the uneven surface to be cleaned. The front surface is equipped with a plurality of vacuum openings and blown air openings. When the cleaning apparatus is suitably connected to a vacuum source and a clean dry air source, fine particles can be dislodged from the grooved surface first by the blown air and then sucked away by the vacuum source through the plurality of vacuum openings.

10 Claims, 5 Drawing Sheets

APPARATUS AND METHOD FOR REMOVING FINE PARTICLES

FIELD OF THE INVENTION

The present invention generally relates to an apparatus and a method for removing fine particles from an uneven surface and more particularly, relates to an apparatus and a method for removing fine particles from a grooved surface wherein the apparatus is equipped with vacuum holes and blown air holes in a surface that intimately contacts the uneven surface to be cleaned such that fine particles are first loosened from the surface by the blown air and then vacuumed away by the vacuum holes.

BACKGROUND OF THE INVENTION

A steady increase in the number of transistors that can be built on a chip surface has gain importance in microelectronics during the past decades. The industry data show that the number of bits/chip will be increased from 1 kilobit (Kb) in the late 1960's to 1 Gigabit (Gb) by the end of the decade. It is recognized that device geometries both in the horizontal and in the vertical directions, must shrink steadily to allow such an increase in density to occur. One other benefit achieved by the scaling down of devices to smaller geometries is the increase in circuit speed. The smaller the minimum feature size, i.e., the minimum line-width or line-to-line separation that can be printed on the surface of a wafer, the larger the number of circuits can be placed on the chip resulting in a higher circuit speed.

One of the most frequently used processing techniques in microelectronics for fabricating integrated circuits (ICs) and very large scale ICs (VLSI) is lithography. The term lithography is used to describe a process in which a pattern is reproduced in a layer of material that is sensitive to photons, electrons or ions. The principle is similar to that used in photography in which an object is imaged on a photosensitive emulsion film. After development, the exposed regions of the film are left as a layer of metallic silver, while the unexposed regions are removed, resulting in a printed image of the object. While the final product is a printed image in photography, the image in microelectronics is typically an intermediate pattern which defines regions where material is to be etched or implanted.

The manufacturing process for IC devices is dependent upon the accurate reproduction of computer aided design (CAD) generated patterns onto the surface of a substrate. The replication process is typically performed by a lithographic technique, specifically an optical lithographic technique, that is preceded and followed by a variety of etching and ion implantation processes. Lithography is a critical step in semiconductor manufacturing because it is used repeatedly in a process sequence that depends on the device design. The lithographic process determines the device dimensions, which affect not only the quality but also its production volume and manufacturing cost. Lithography transforms complex circuit diagrams into patterns which are defined on the wafer in a succession of exposure and processing steps to form a number of superimposed layers of insulators, conductors and semiconductor materials. For instance, typically between 5 and 30 lithographic steps and several hundred processing steps between exposures are required to fabricate a semiconductor IC package.

A typical photolithographic process can be carried out on a wafer surface by the operating steps of first oxidizing the silicon surface to obtain a thin layer of silicon dioxide, then coating a layer of material that is sensitive to radiations such as ultraviolet light, electron beams or X-ray beams, then imprint a latent image on the material by a lithographic patterning technique, then amplify the latent image by an appropriate development method, the reserve areas delimiting the design to be reproduced on the silicon dioxide layer, then stabilize the image by an appropriate fixing method or a lithography method, and then plasma etching the silicon dioxide surface through openings obtained in the dioxide layer to obtain areas variously doped in the silicon dioxide subsequently defining two-dimensional geometric shapes on the surface of the substrate for the circuit, such as the gate electrodes, contacts, vias and metal interconnects.

Optical lithography, as commonly used in the manufacture of integrated circuits (ICs) and very large scale ICs (VLSI), involves a series of steps for obtaining complex etched structures on a wafer. An optical lithographic patterning process involves the illumination of a metallic coated quartz plate known as a photomask which contains a magnified image of the computer generated pattern etched into the metallic layer. An illuminated image is reduced in size and patterned onto a photosensitive film deposited on the device substrate. Each time the photolithographic steps are repeated, the accuracy of the process determines the quality and the yield of the IC fabrication process. The performance enhancement of advanced VLSI circuitry is increasingly limited by the lack of pattern fidelity in a series of lithographic and reactive ion etching (RIE) processes conducted at extremely small dimensions (e.g., in the sub-half-micron level). In a photolithographic process, a pattern is transferred from a photomask to a photosensitive film (i.e., a photoresist layer) on a wafer. In the RIE process, the pattern in the photoresist is in turn transferred into a variety of conductive or insulating films on the wafer substrate. A successful fabrication process for integrated circuits is therefore closely dependent upon a successful lithographic technique.

During each lithographic step, deviations may be introduced to distort the image that the photomask transfers to the wafer surface. For example, as a result of an optical interference and other interferences which occur during a pattern transfer, images formed on a wafer surface deviate from the original dimension and shape of the photomask that was stored in the computer. The deviations depend on the characteristics of the pattern as well as a variety of processing parameters. Since deviations significantly affect the performance of a semiconductor device, different techniques have been developed to focus on methods of compensation for the optical proximity effect so that they can be included in a CAD file to improve the image transfer process.

Other processing parameters during a photolithography step may also affect the accuracy of the transfer of images. For instance, when the lithography process is carried out in a stepper apparatus for transferring an image from a photomask to a photoresist layer on the wafer, the absolute flatness of an exposure table on which the wafer is positioned is also a critical factor. It has been found that even with the presence of a few dust particles, a local defocus on the wafer positioned on the table may lead to serious die loss on the wafer due to poor imaging. The exposure table, i.e., commonly known as the E-table, is designed to minimize the dust particle problem. For instance, the surface of the exposure table is designed in a grooved pattern to minimize the chances of dust particles contacting a wafer positioned thereon. While dust particles that have fallen into the grooves should not present a problem to the focus of the stepper, the particles may be carried out of the grooves and fall on top of the table by any air disturbance in the stepper.

The dust particles then cause local defocus when the wafer is exposed due to a change in focus length by the presence of the particles. Other factors, such as static electricity or electrostatic attraction may also cause the dust particles to move from the bottom of the grooves to the top surface of the exposure table.

In order to thoroughly clean the top surface of an exposure table in a stepper, a cleaning tool is frequently provided by the stepper manufacturer. A typical cleaning tool supplied is a small vacuum apparatus equipped with numerous vacuum openings on a contact surface. One of such cleaning tool is shown in FIGS. 1A and 1B.

Figure 1A:
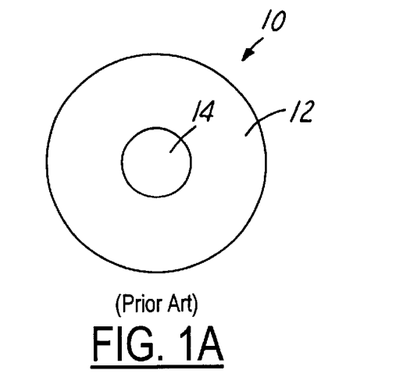
FIG. 1A is a plane view of the front surface of a conventional cleaning apparatus showing a vacuum aperture.
Figure 1B:
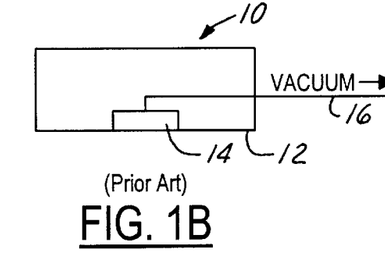
FIG. 1B is a cross-sectional view of the conventional cleaning apparatus of FIG. 1A showing the vacuum opening and a vacuum passageway.
Figure 2A:
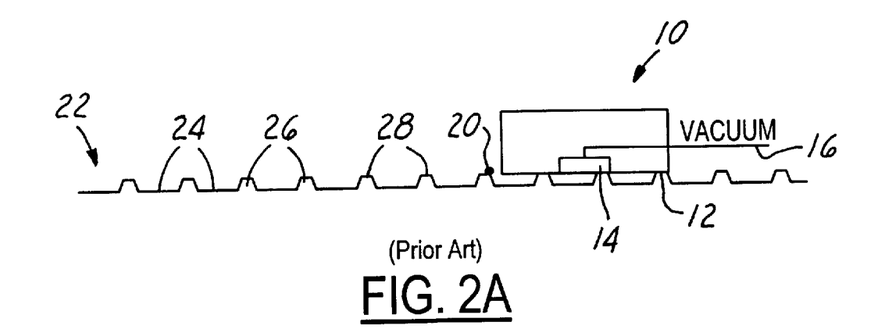
FIG. 2A~2D are graphs illustrating the operation of a conventional vacuum pick-up device in picking up a fine particle from a grooved surface.
Figure 2B:
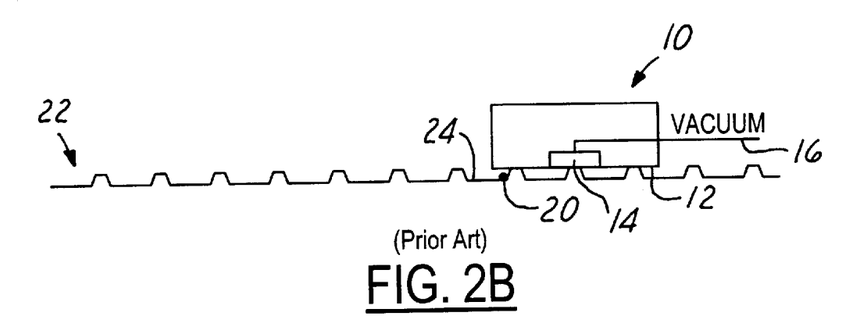
Figure 2C:
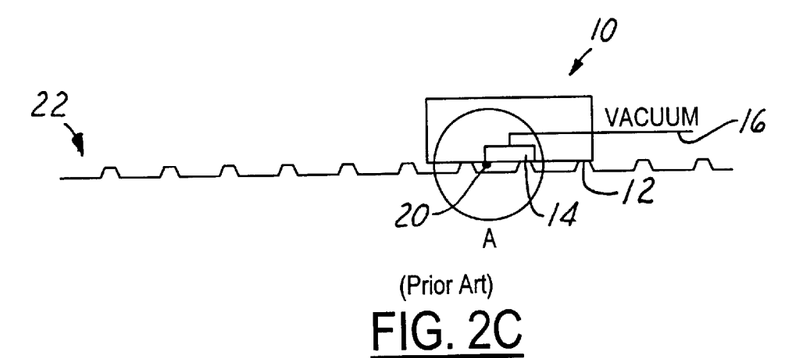
Figure 2D:
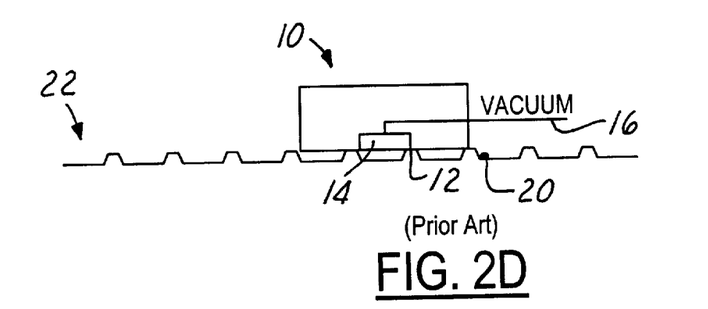

FIG. 1A is a plane view of a contact surface of a conventional vacuum apparatus 10 indicating a contact surface 12 fabricated of a metallic or a ceramic material and provided with a centrally located aperture 14 as a vacuum passage. A cross-sectional view of the cleaning apparatus 10 is shown in FIG. 1B. A vacuum passageway 16 is used for establishing fluid communication with the vacuum aperture 14 such that a vacuum force can be provided at the aperture 14. The vacuum apparatus 10 is not always effective in removing fine particles from a grooved surface of a stepper exposure table. For instance, as shown in FIG. 2A, a dust particle 20 may be present at the shoulder portion of a grooved surface 22. The fine dust particle normally has a particle size of a few microns. In the grooved surface 22, the bottom surface 24 of the grooves are separated by sidewalls 26 of the grooves which also have a top surface 28. When a conventional vacuum apparatus 10 is pressed upon the grooved surface 22, i.e., with the contact surface 12 of the vacuum apparatus 10 intimately touching the top surface 28 of the grooved surface 22, the mechanical motion of the vacuum apparatus 10 first pushes the dust particle 20 on the shoulder portion such that it falls into the bottom surface 24 of the groove surface 22. This is shown in FIG. 2B. As the vacuum apparatus 10 is pushed further along the top surface 28, as shown in FIG. 2C, the vacuum aperture 14 is moved to a position that it is on top of the dust particle 20. However, with the dust particle 20 sitting on the bottom surface 24 in the grooves, the vacuum force exerted through the aperture 14 is insufficient to loosen the dust particle 20 from the bottom surface 24 and to suck it up into the vacuum aperture 14. As a result, after the vacuum apparatus 10 is further pushed along the top surface 28, the dust particle 20 remains on the bottom surface 24 of the grooved surface 22. This is shown in FIG. 2D. The ineffectiveness of the conventional apparatus 10 in removing fine dust particles is therefore fully demonstrated in FIGS. 2A~2D.

It is therefore an object of the present invention to provide a cleaning apparatus for removing fine particles from an uneven surface that does not have the drawbacks or shortcomings of the conventional cleaning apparatus.

It is another object of the present invention to provide a cleaning apparatus for removing fine particles from an uneven surface such that the apparatus can be advantageously used in removing particles having a size of several microns.

It is a further object of the present invention to provide a cleaning apparatus for removing fine particles from an uneven surface that can be advantageously used in semiconductor processing equipment such as in a photolithographic apparatus.

It is another further object of the present invention to provide a cleaning apparatus for removing fine particles from an uneven surface wherein the uneven surface is an exposure table having a grooved top surface used in a stepper.

It is still another object of the present invention to provide a cleaning apparatus for removing fine particles from an uneven surface wherein both air holes and vacuum holes are provided in a contact surface of the apparatus.

It is yet another object of the present invention to provide a cleaning apparatus for removing fine particles from an uneven surface wherein the apparatus is effective in picking up fine particles by vacuum apertures after the particles are first loosened from the uneven surface by an air flow provided by the cleaning apparatus.

It is still another further object of the present invention to provide a method for removing fine particles from an uneven surface which can be carried out by first loosening the particles from an uneven surface by an air flow and then picking up the particles into a vacuum aperture of the cleaning apparatus.

It is yet another further object of the present invention to provide a cleaning apparatus for removing fine particles from an uneven surface wherein the apparatus may be constructed by three sections stacked together for providing a plurality of vacuum openings and air holes in a contact surface of the cleaning apparatus.

SUMMARY OF THE INVENTION

In accordance with the present invention, an apparatus and a method for removing fine particles in micron sizes from an uneven surface such as a grooved surface are provided.

In a preferred embodiment, a cleaning apparatus for removing fine particles from an uneven surface can be provided which includes a cleaning head having generally a handle portion and a head portion integrally joined together, the head portion has a substantially planar front surface for contacting the uneven surface to be cleaned, the front surface of the head portion further includes at least one vacuum opening and at least one blown air opening, a vacuum passageway through the handle portion in fluid communication with the at least one vacuum opening, and a blown air passageway through the handle portion in fluid communication with the at least one blown air opening.

The cleaning apparatus for removing fine particles may further include a vacuum source for supplying a negative pressure to the vacuum passageway, and a clean dry air source (CDA) for supplying a positive pressure to the blown air passageway. The cleaning apparatus may further include a head portion constructed in a circular shape. The cleaning apparatus may further include a plurality of vacuum openings in the front (or contact) surface of the head portion, or a plurality of blown air openings in the front surface of the head portion.

The cleaning apparatus may further include adapters for connecting the vacuum passageway and the blown air passageway to the source of vacuum and the source of clean dry air, respectively. The cleaning apparatus is capable of removing fine particles from a grooved surface. The at least one vacuum opening is arranged along a peripheral edge and at a center in the front surface of the head portion. The at least one blown air opening is arranged circumferentially around a center in the front surface of the head portion. The cleaning apparatus may further include not less than 9 vacuum openings and not less than 4 blown air openings.

The present invention is further directed to a method for removing fine particles from an uneven surface which can be carried out by the operating steps of first providing a cleaning apparatus that includes a cleaning head having generally a handle portion and a head portion integrally joined together, the head portion has a substantially planar front surface for contacting the uneven surface to be cleaned, the front surface of the head portion further includes at least one vacuum opening and at least one blown air opening, a vacuum passageway and a blown air passageway through the handle portion in fluid communication with the at least one vacuum opening and the at least one blown air opening, respectively, then pressing the cleaning apparatus against the uneven surface to be cleaned such that the front surface of the head portion intimately contacting the uneven surface, flowing a clean dry air into the blown air passageway such that fine particles are blown off and loosened from the uneven surface, and pulling vacuum from the vacuum passageway such that fine particles blown off and loosened from the uneven surface are carried away through the at least one vacuum opening into a vacuum source.

The method for removing fine particles from an uneven surface may further include the step of providing a vacuum source for pulling vacuum from the vacuum passageway. The method may further include the step of providing a clean dry air source for supplying a positive pressure to the blown air passageway. The method may further include in the step of providing the head portion in a substantially circular shape. The at least one vacuum opening may further include a plurality of vacuum openings arranged in a circumferential pattern in the front surface of the head portion. The at least one blown air opening may further include a plurality of apertures arranged in a circumferential pattern juxtaposed to a plurality of vacuum openings in the front surface of the head portion. The method may further include the step of moving the cleaning apparatus on the uneven surface to be cleaned when the cleaning apparatus is pressed against the uneven surface, the clean dry air is flown into the blown air passageway and vacuum is pulled from the vacuum passageway. The at least one vacuum opening may further include an opening at a center of the front surface of the head portion and a circular vacuum ring formed along a peripheral edge in the front surface of the head portion.

In an alternate embodiment, a cleaning apparatus for removing fine particles from an uneven surface can be provided which includes a cleaning head that has a handle portion and a head portion, the head is formed by stacking together a front section, a middle section and a back section, the front section has a front surface for contacting the uneven surface to be cleaned, the front section may further include at least one vacuum opening and at least one blown air opening, a vacuum passageway through the middle section in fluid communication with the at least vacuum opening in the front section, and a blown air passageway through the back section in fluid communication with the at least one blown air opening in the front section through a second blown air passageway provided in the middle section.

In the cleaning apparatus for removing fine particles, the front section, the middle section and the back section may be stacked together and fastened by mechanical means. The at least one vacuum opening may include an aperture at the center of the front surface and a circular ring-shaped opening at the peripheral of the front surface. The at least one blown air opening may include a plurality of apertures arranged in a circumferential pattern around a center of the front surface of the head portion.

BRIEF DESCRIPTION OF THE DRAWINGS

The objects, features and advantages of the present invention will become apparent from the following detailed description and the appended drawings in which.

DETAILED DESCRIPTION OF THE PREFERRED EMBODIMENT

The present invention discloses a cleaning apparatus which can be used for removing fine particles from an uneven surface, and is particularly useful in picking up particles in the range of micron sizes from a grooved surface such as a surface on an exposure table in a stepper machine for semiconductor fabrication. The apparatus may be constructed by a cleaning head which has generally a handle portion and a head portion that are integrally formed together. The head portion may have a substantially planar front surface for contacting the uneven surface to be cleaned. At least one vacuum opening and at least one blown air opening are provided in the front surface of the head portion. The handle portion is provided with a vacuum passageway and a blown air passageway in fluid communication with the at least one vacuum opening and the at least one blown air opening, respectively. The present invention cleaning apparatus may further include the components of a vacuum source for supplying a negative pressure to the vacuum passageway and a clean dry air source for supplying a positive pressure to the blown air passageway.

The present invention further provides a method for removing fine particles from an uneven surface which can be carried out by the operating steps of first providing a cleaning apparatus that has a cleaning head with a handle portion and a head portion integrally joined together, the head portion has a substantially planar front surface for contacting the uneven surface to be cleaned wherein the front surface includes a plurality of vacuum openings and a plurality of blown air openings. The handle portion includes a vacuum passageway and a blown air passageway for feeding a vacuum or a blown air to the plurality of vacuum openings and the plurality of blown air openings. The method can then be carried out by first pressing the cleaning apparatus against the uneven surface to be cleaned such that the front surface of the head portion intimately contacting the uneven surface, flowing a clean dry air into the blown air passageway such that fine particles are blown off and loosened from the uneven surface, and then pulling vacuum from the vacuum passageway such that fine particles loosened from the uneven surface can be carried away through the plurality of vacuum openings into a vacuum source.

Figure 3A:
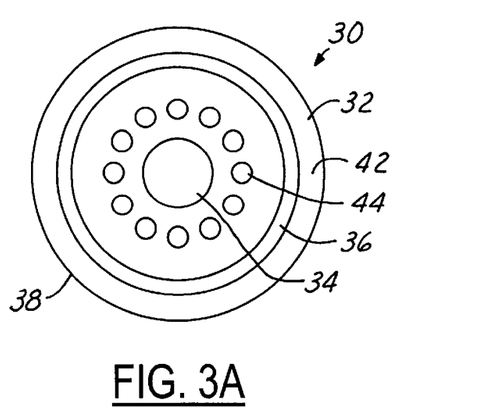
FIG. 3A is a plane view of a front surface of the present invention cleaning apparatus showing the plurality of vacuum openings and blown air openings.
Figure 3B:
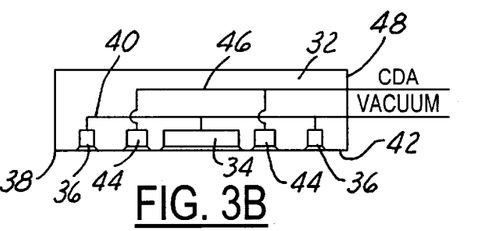
FIG. 3B is a cross-sectional view of the present invention cleaning apparatus of FIG. 3A showing the pluralities of vacuum openings, blown air openings and their respective passageways.

Referring now to FIGS. 3A and 3B wherein a present invention cleaning apparatus is shown in a plane view and in a cross-sectional view. The present invention cleaning apparatus 30, is first shown in a plane view of the front surface of the head portion 32 in FIG. 3A. A cross-sectional view of the head portion 32 is shown in FIG. 3B. A large center vacuum opening 34 is provided together with a circular vacuum ring 36 formed along a peripheral edge 38 in the front surface 42 of the head portion 32. A plurality of blown air openings 44 are also shown in FIGS. 3A and 3B which are in fluid communication with a blown air passageway 46 connected to a clean dry air supply (not shown). The vacuum openings 34, 36 are in fluid communication with a vacuum passageway 40 which is connected to a vacuum source (not shown). It should be noted that the configuration shown in FIGS. 3A and 3B is only one of many possible configurations for practicing the present invention novel method. For instance, instead of a circular vacuum ring 36, a plurality of vacuum apertures may be provided in its place. Similarly, instead of a plurality, i.e., a total of 12 shown in FIG. 3A, of blown air openings 44, a circular blown air ring similar to the circular vacuum ring may also be utilized.

A suitable material for fabricating the present invention cleaning apparatus should have a required hardness and dimensional stability in a wide range of application temperatures. It can be a ceramic material, or any other materials that meets the necessary property requirements. It is desirable that the blown air openings 44 be positioned in-between vacuum openings 34, 36 such that fine particles blown up and loosened from the surface cleaned are picked up by vacuum through the vacuum openings 34, 36. On the peripheral surface 48 of the head portion 32, adapters are provided to facilitate the connection of clean dried air and vacuum to the passageways 46, 40.

The present invention novel cleaning apparatus can be fabricated in any desirable manner as long as a general structure such as that shown in FIGS. 3A and 3B is achieved. The pattern of the vacuum openings and the blown air openings can also be designed to suit any specific applications. A preferred embodiment, which is in no way the only embodiment for fabricating the present invention novel cleaning apparatus 30, is shown in FIGS. 4, 5, 6 and 7.

Figure 4A:
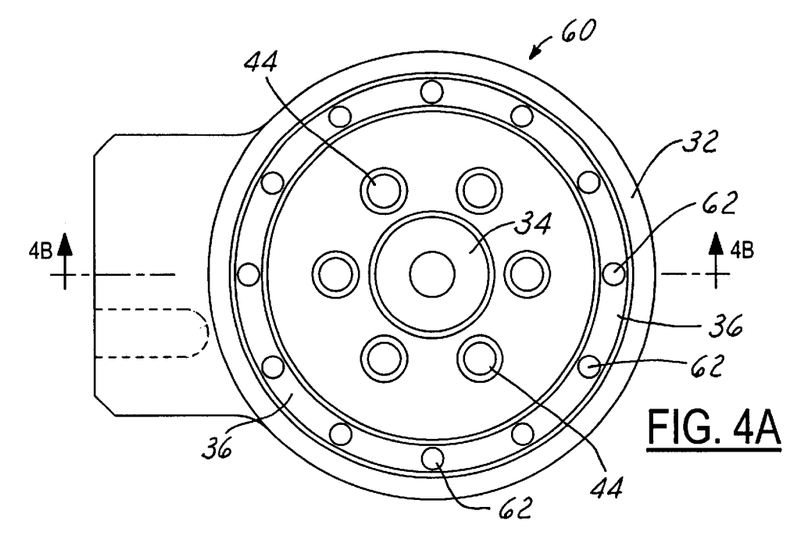
FIG. 4 is a plane view and a cross-sectional view of a front section of the present invention cleaning apparatus.
Figure 4B:
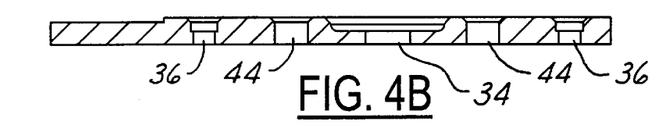

As shown in FIG. 4, a preferred embodiment of the present invention cleaning apparatus 50 is illustrated. The cleaning apparatus 50 is constructed by two major parts of a head portion 32 and a handle portion 52 which are integrally formed together. In the preferred embodiment, the present invention novel cleaning apparatus is constructed by stacking together three different sections of a front section 60, a middle section 70 and a back section 80. The front section 60 is shown in FIG. 4 in a cross-sectional view and in a plane view. The front section 60 can be advantageously formed from a ceramic plate with the apertures 34, 36 and 44 provided by a chemical etching method. Similar to that shown in FIG. 3B, a central vacuum opening 34 and a circular vacuum ring 36 are provided as the vacuum apertures. A plurality, i.e., a total of 6, of blown air openings 44 are provided in the front section 60. A series of mounting holes 62 are also provided through the vacuum ring 36 such that the front section 60 can be mounted to the middle and back sections.

Figure 5A:
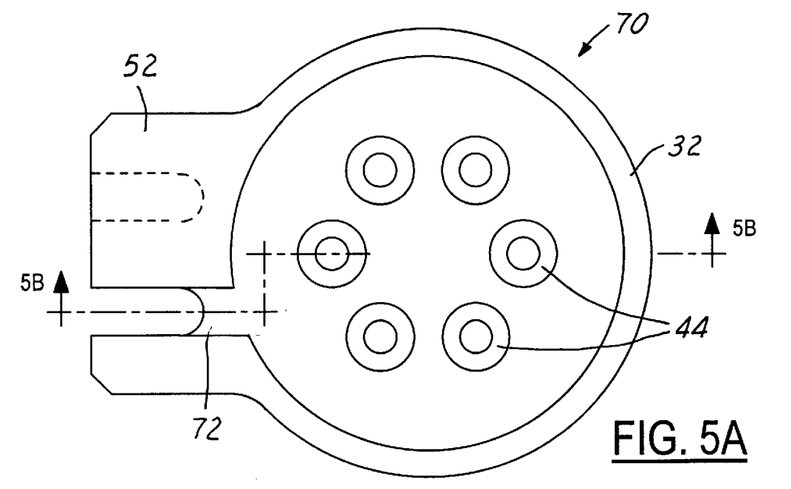
FIG. 5 is a plane view and a cross-sectional view of a middle section for the present invention cleaning apparatus.
Figure 5B:
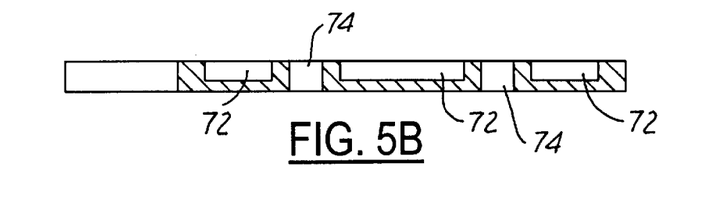

A plane view and a cross-sectional view of the middle section 70 for the present invention novel cleaning apparatus 50 is shown in FIG. 5. The middle section 70 is also constructed in a head portion 32 and a handle portion 52. A vacuum passageway 72 is provided in the middle section 70 such that it is in fluid communication with the vacuum openings 34, 36 that are provided in the front section 60. Through holes 74 are provided through the entire thickness of the middle section 70 for providing a passageway for the blown air openings 44. It should be noted that the through holes 74 are not interconnected with the vacuum passageway 72 or the vacuum openings 34, 36.

Figure 6A:
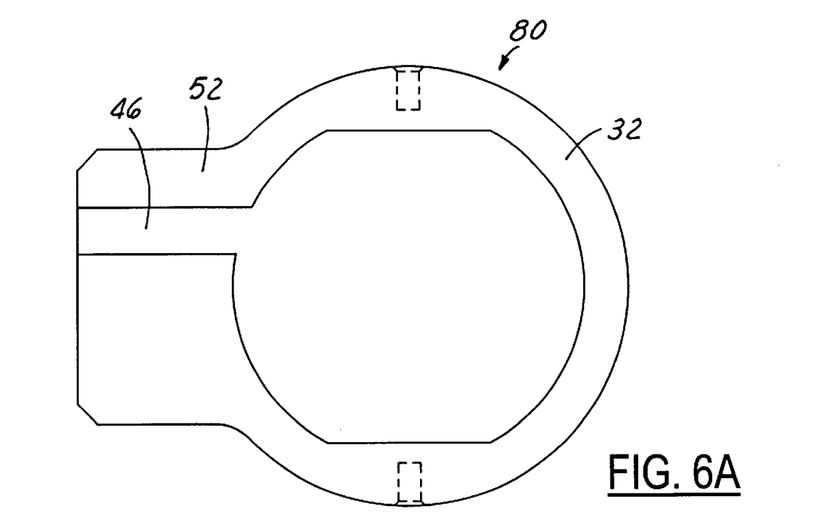
FIG. 6 is a plane view and a cross-sectional view of a back section of the present invention cleaning apparatus.
Figure 6B:
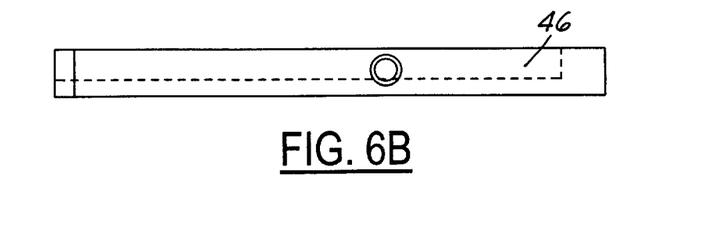
Figure 7A:
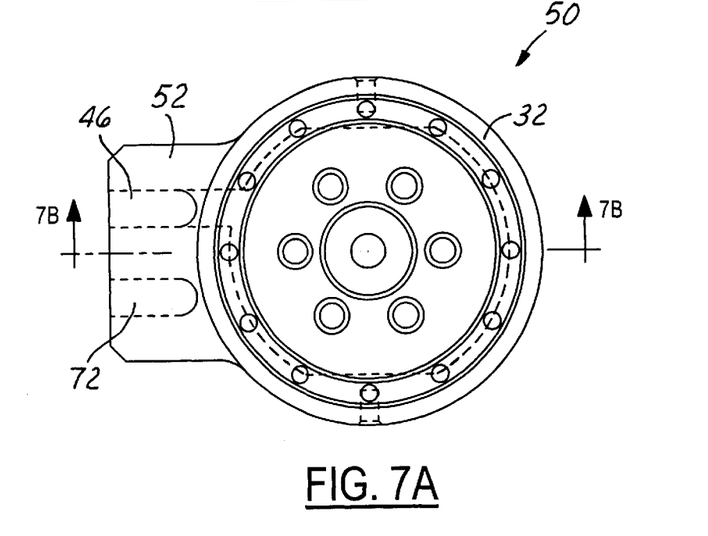
FIG. 7 is a plane view and a cross-sectional view of the present invention cleaning apparatus assembled together by the front section, the middle section and the back section.
Figure 7B:
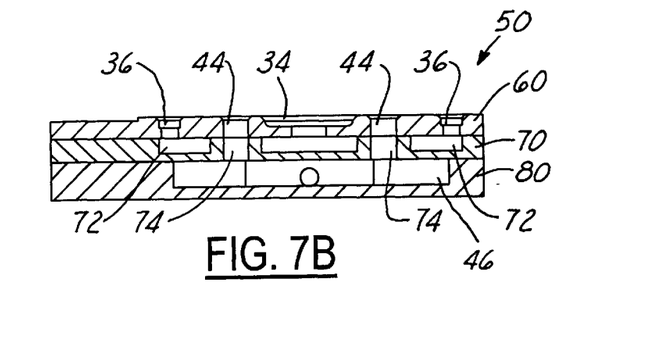
Figure 7C:
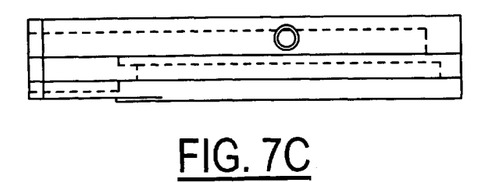
Figure 7D:
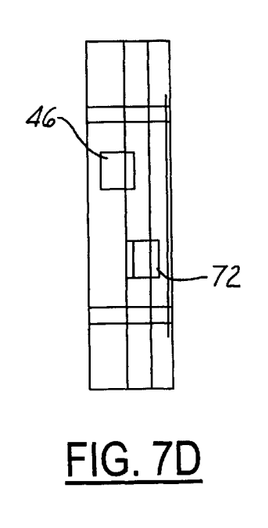

FIG. 6 shows a plane view and a cross-sectional view of the back section 80. The back section 80 provides a blown air passageway 46 which is provided for fluid communication with the blown air openings 44 through the blown air passageway 74 in the middle section 70. An assembled view of the front section 60, the middle section 70 and the back section 80 is shown in FIG. 7 to form the present invention novel cleaning apparatus 50. It should be noted that, with the present invention novel design shown in the preferred embodiment 50, a compact cleaning apparatus 50 can be formed by stacking and fastening together the front section 60, the middle section 70 and the back section 80 for providing vacuum to the vacuum openings 34, 36 and blown air to the blown air openings 44 through the vacuum passageway 72 and blown air passageway 46, respectively. It should also be noted that while FIG. 7 shows the present invention preferred embodiment 50, the present invention can be easily carried out in other configurations that is different than that shown in FIG. 7 while achieving the same desirable results.

Figure 8A:
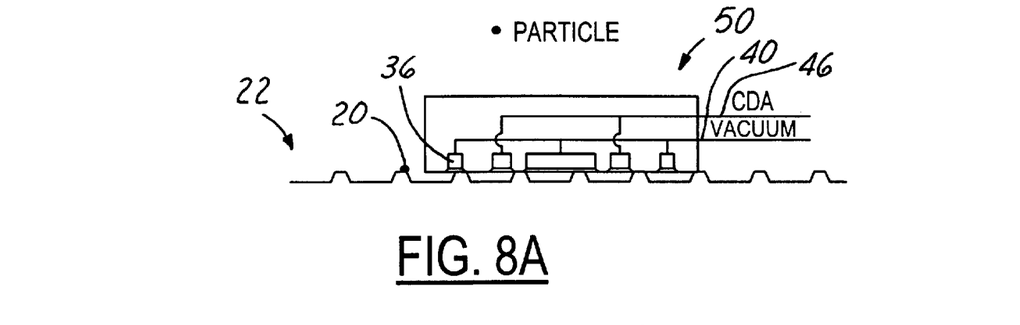
FIG. 8A~8D are graphs illustrating the operation of the present invention cleaning apparatus in picking up fine particles.
Figure 8B:
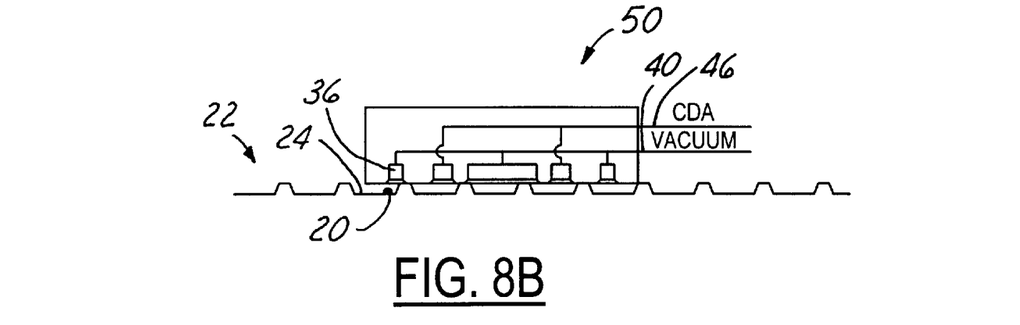
Figure 8C:
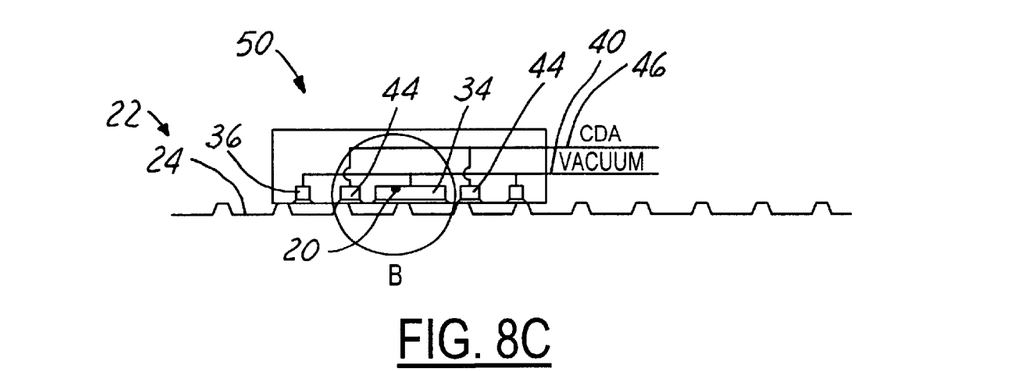
Figure 8D:
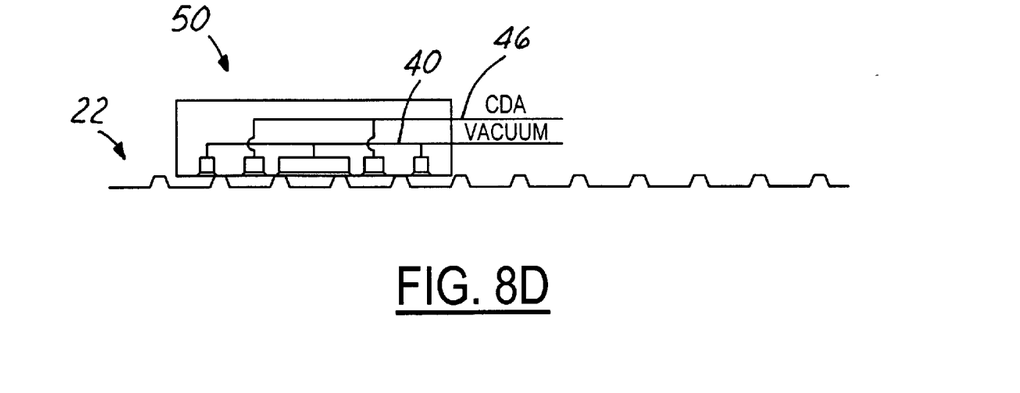

The operation of the present invention novel cleaning apparatus 50 is shown in FIGS. 8A~8D. A grooved surface 22 is provided which has a fine dust particle 20 lodged on top of the surface. When the present invention cleaning apparatus 50 is positioned on the grooved surface 22, the first vacuum opening 36, i.e., of the circular vacuum ring, fails to pick up the dust particle 20. This is shown in FIGS. 8A and 8B. The blown air opening 44 then passes over the dust particle 20 and the air pressure blows the particle up and away from the bottom surface 24 of the grooved surface 22. The dust particle 20 is then picked up by the center vacuum opening 34. This is shown in FIG. 8C. In the next step, the dust particle 20 is carried away by the vacuum passageway 40 and removed from the grooved surface 22. This is shown in FIG. 8D.

The present invention novel cleaning apparatus and a method for using such cleaning apparatus have been amply demonstrated in the above descriptions and in the appended drawings of FIGS. 3~8D.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A cleaning apparatus for removing fine particles from an uneven surface comprising:

a cleaning head having generally a handle portion and a head portion integrally joined together, said head portion having a substantially planar front surface for contacting said uneven surface to be cleaned, said front surface of the head portion further comprises not less than nine vacuum openings and not less than four blown air openings, a vacuum passageway through said handle portion in fluid communication with said at least one vacuum opening, and a blown air passageway through said handle portion in fluid communication with said at least one blown air opening.

2. A cleaning apparatus for removing fine particles from an uneven surface according to claim 1 further comprising:

a vacuum source for supplying a negative pressure to said vacuum passageway, and a clean dry air source for supplying a positive pressure to said blown air passageway.

3. A cleaning apparatus for removing fine particles from an uneven surface according to claim 2, wherein said handle portion further comprises adapters for connecting said vacuum passageway and said blown air passageway to said source of vacuum and said source of clean dry air, respectively.

4. A cleaning apparatus for removing fine particles from an uneven surface according to claim 1, wherein said head portion is constructed in substantially a circular shape.

5. A cleaning apparatus for removing fine particles from an uneven surface according to claim 1, wherein said not less than nine vacuum openings being arranged along a peripheral edge and at a center in said front surface of the head portion, respectively.

6. A cleaning apparatus for removing fine particles from an uneven surface according to claim 1, wherein said not less than four blown air openings being arranged circumferentially around a center in said front surface of the head portion.

7. A cleaning apparatus for removing fine particles from an uneven surface comprising:

a cleaning head having a handle portion and a head portion, said head being formed by stacking together a front section, a middle section and a back section, said front section having a front surface for contacting said uneven surface to be cleaned, said front section further comprises at least one vacuum opening and at least one blown air opening, a vacuum passageway through said middle section in fluid communication with said at least one vacuum opening in said front section, and a blown air passageway through said back section in fluid communication with said at least one blown air opening in said front section through a second blown air passageway provided in said middle section.

8. A cleaning apparatus for removing fine particles from an uneven surface according to claim 7, wherein said front section, said middle section and said back section are fastened by mechanical means.

9. A cleaning apparatus for removing fine particles from an uneven surface according to claim 7, wherein said at least one vacuum opening comprises an aperture at the center of said front surface and a circular ring-shaped opening at the periphery of said front surface.

10. A cleaning apparatus for removing fine particles from an uneven surface according to claim 7, wherein said at least one blown air opening comprises a plurality of apertures arranged in a circumferential pattern around a center of said front surface of the head portion.

\* \* \* \* \*